US011233535B2

(12) United States Patent
Chang

(10) Patent No.: US 11,233,535 B2
(45) Date of Patent: Jan. 25, 2022

(54) RECEIVER FRONT-END CIRCUIT AND OPERATING METHOD THEREOF

(71) Applicant: Raydium Semiconductor Corporation, Hsinchu (TW)

(72) Inventor: Chia-Hua Chang, Hsinchu (TW)

(73) Assignee: Raydium Serniconductor Corporation, Hsinchu County (TW)

( * ) Notice: Subject to any disclaimer, the term of this patent is extended or adjusted under 35 U.S.C. 154(b) by 172 days.

(21) Appl. No.: 16/727,000

(22) Filed: Dec. 26, 2019

(65) Prior Publication Data
US 2020/0220566 A1    Jul. 9, 2020

(30) Foreign Application Priority Data

Jan. 4, 2019    (TW) ................... 108100392

(51) Int. Cl.
*H03F 3/45*    (2006.01)
*H03F 3/191*    (2006.01)
*H04B 1/16*    (2006.01)
*H04L 25/03*    (2006.01)
*H03F 3/04*    (2006.01)

(52) U.S. Cl.
CPC ............... *H04B 1/16* (2013.01); *H03F 3/04* (2013.01); *H04L 25/03006* (2013.01); *H03F 2200/372* (2013.01)

(58) Field of Classification Search
CPC .......... H03F 3/04; H03F 3/45; H03F 3/45479; H03F 3/191
USPC ................................................... 330/258, 304
See application file for complete search history.

(56) References Cited

U.S. PATENT DOCUMENTS 3,845,404 A * 10/1974 Trilling ............... H03F 3/45479
330/69
2012/0229214 A1* 9/2012 Kasanyal ............ H03F 3/45632
330/253

* cited by examiner

*Primary Examiner* — Steven J Mottola

(57) ABSTRACT

A receiver front-end circuit and an operating method thereof are disclosed. The receiver front-end circuit includes a common-mode suppression circuit and a rear-stage circuit. The common-mode suppression circuit is used to receive an external input common-mode voltage signal and perform common-mode noise suppression processing on the external input common-mode voltage signal, and then output an internal input common-mode voltage signal. The rear-stage circuit is coupled to the common-mode suppression circuit and used to receive the internal input common-mode voltage signal. The dynamic swing of the internal input common-mode voltage signal is smaller than the dynamic swing of the external input common-mode voltage signal.

9 Claims, 8 Drawing Sheets

RECEIVER FRONT-END CIRCUIT AND OPERATING METHOD THEREOF

BACKGROUND OF THE INVENTION

1. Field of the Invention

The invention relates to a receiver; in particular, to a receiver front-end circuit and an operating method thereof.

2. Description of the Prior Art

Please refer to FIG. 1. FIG. 1 illustrates a schematic diagram of a conventional receiver front-end equalizer. As shown in FIG. 1, the conventional receiver front-end equalizer 1 can amplify the signal it receives and eliminate the inter-symbol interference (ISI) effect. However, the conventional receiver front-end equalizer 1 has its operating limitations to the common-mode voltage range of the input signal.

In general, the common-mode voltage can be divided into a static common-mode voltage and a dynamic common-mode voltage. The limitation of the static common-mode voltage range can usually be solved by choosing to use a P-type input stage or an N-type input stage. Under a normal condition, the dynamic common-mode voltage is usually maintained within a small disturbance range.

However, once the input signal is disturbed, it is likely to cause a lot of dynamic common-mode voltage disturbances, thereby causing the receiver front-end equalizer 1 to fail.

For example, as shown in FIG. 2, when the receiver front-end equalizer 1 is operated normally, the input signal is suddenly disturbed by the noise, causing a phenomenon of dynamic common-mode voltage disturbance. The region R1 of the common-mode voltage CV is a stable common-mode voltage CV1 and the region R2 of the common-mode voltage CV is a common-mode voltage CV2 with dynamic common-mode voltage disturbance, so that the receiver front-end equalizer 1 cannot operate normally. This problem needs urgent improvement.

SUMMARY OF THE INVENTION

Therefore, the invention provides a receiver front-end circuit and an operating method thereof to improve the uniformity of the display brightness.

An embodiment of the invention is a receiver front-end circuit. In this embodiment, the receiver front-end circuit includes a common-mode suppression circuit and a rear-stage circuit. The common-mode suppression circuit is used to receive an external input common-mode voltage signal and perform common-mode noise suppression processing on the external input common-mode voltage signal, and then output an internal input common-mode voltage signal. The rear-stage circuit is coupled to the common-mode suppression circuit and used to receive the internal input common-mode voltage signal. The dynamic swing of the internal input common-mode voltage signal is smaller than the dynamic swing of the external input common-mode voltage signal.

In an embodiment, the rear-stage circuit is a receiver front-end equalizer. The receiver front-end equalizer includes a first resistor, a second resistor, a first transistor, a second transistor, a third transistor, a fourth transistor, a resistor and a capacitor. The first transistor is coupled to the first resistor, wherein a gate of the first transistor is coupled to the common-mode suppression circuit. The second transistor is coupled to the second resistor, wherein a gate of the second transistor is coupled to the common-mode suppression circuit. The third transistor is coupled between the first transistor and a ground terminal. The fourth transistor is coupled between the second transistor and the ground terminal. One terminal of the resistor is coupled between the first transistor and the third transistor and another terminal of the resistor is coupled between the second transistor and the fourth transistor. One terminal of the capacitor is coupled between the first transistor and the third transistor and another terminal of the capacitor is coupled between the second transistor and the fourth transistor.

In an embodiment, the rear-stage circuit is an amplifier circuit.

In an embodiment, the common-mode suppression circuit includes a first capacitor, a second capacitor, a first resistor, a second resistor, a third resistor, a fourth resistor, a fifth transistor, a sixth transistor, a seventh transistor, an eighth transistor, a fifth resistor and a sixth resistor. The first capacitor is coupled between a first input terminal and a first node. The second capacitor is coupled between a second input terminal and a second node. The first resistor is coupled to the first node. The second resistor is coupled between the first node and a ground terminal. The third resistor is coupled to the second node. The fourth resistor is coupled between the second node and the ground terminal. A gate of the fifth transistor is coupled to the first node. A gate of the sixth transistor is coupled to the second node. The seventh transistor is coupled to the fifth transistor and the sixth transistor at a third node. The eighth transistor is coupled between the seventh transistor and the ground terminal. The fifth resistor is coupled to the fifth transistor at a first output terminal. The sixth resistor is coupled to the sixth transistor at a second output terminal.

In an embodiment, when the first input terminal and the second input terminal of the common-mode suppression circuit receive external input common-mode voltage signal, a DC voltage of the external input common-mode voltage signal is blocked by the first capacitor and the second capacitor.

In an embodiment, the internal input common-mode voltage signal is generated by using the first resistor and the second resistor in series and the third resistor and the fourth resistor in series to divide voltage, or using a current source with a resistor string, or using a feedback amplifier to generate a bias voltage.

In an embodiment, a cascade tail current flowing through the seventh transistor and the eighth transistor in series provides a common-mode noise suppression capability to eliminate the dynamic swing of the internal input common-mode voltage signal.

In an embodiment, the first transistor, the second transistor, the third transistor and the fourth transistor are N-type transistors.

Another embodiment of the invention is a receiver front-end circuit. In this embodiment, the receiver front-end circuit includes a rail-to-rail input stage and a rear-stage circuit. The rail-to-rail input stage is configured to increase an input common-mode voltage receiving range to completely receive an external input common-mode voltage signal with dynamic common-mode voltage disturbance, perform an amplifying processing on the external input common-mode voltage signal and output an internal input common-mode voltage signal. The rear-stage circuit is coupled to the rail-to-rail input stage and configured to receive the internal input common-mode voltage signal. Wherein, the input common-mode voltage receiving range of the rail-to-rail input stage is larger than the input common-mode voltage receiving range of the rear-stage circuit.

In an embodiment, the rear-stage circuit is a receiver front-end equalizer. The receiver front-end equalizer includes a first resistor, a second resistor, a first transistor, a second transistor, a third transistor, a fourth transistor, a resistor and a capacitor. The first transistor is coupled to the first resistor, wherein a gate of the first transistor is coupled to the rail-to-rail input stage. The second transistor is coupled to the second resistor, wherein a gate of the second transistor is coupled to the rail-to-rail input stage. The third transistor is coupled between the first transistor and a ground terminal. The fourth transistor is coupled between the second transistor and the ground terminal. One terminal of the resistor is coupled between the first transistor and the third transistor and another terminal of the resistor is coupled between the second transistor and the fourth transistor. One terminal of the capacitor is coupled between the first transistor and the third transistor and another terminal of the capacitor is coupled between the second transistor and the fourth transistor.

In an embodiment, the rail-to-rail input stage includes a current source, a fifth transistor, a sixth transistor, a seventh transistor, an eighth transistor, a ninth transistor, a tenth transistor, an eleventh transistor, a twelfth transistor, a thirteen transistor, a first resistor and a second resistor. The fifth transistor is coupled to the current source. The sixth transistor is coupled to the current source. The seventh transistor is coupled to the fifth transistor at a first node. The eighth transistor is coupled to the sixth transistor at a second node. The ninth transistor is coupled between the first node and a ground terminal. The tenth transistor is coupled between the second node and the ground terminal. The eleventh transistor is coupled to a third node, wherein a gate of the eleventh transistor is coupled to a first input terminal. The twelfth transistor is coupled to a fourth node, wherein a gate of the twelfth transistor is coupled to a second input terminal. The thirteen transistor is coupled between a fifth node and the ground terminal. The first resistor is coupled to the third node and a first output terminal. The second resistor is coupled to the fourth node and a second output terminal.

Another embodiment of the invention is a receiver front-end circuit operating method. In this embodiment, the receiver front-end circuit operating method is used for operating a receiver front-end circuit. The receiver front-end circuit includes a common-mode suppression circuit and a rear-stage circuit. The receiver front-end circuit operating method includes steps of: (a) the common-mode suppression circuit receiving an external input common-mode voltage signal, performing a common-mode noise suppression processing on the external input common-mode voltage signal and outputting an internal input common-mode voltage signal; and (b) the rear-stage circuit receiving the internal input common-mode voltage signal from the common-mode suppression circuit; wherein a dynamic swing of the internal input common-mode voltage signal is smaller than a dynamic swing of the external input common-mode voltage signal.

In an embodiment, in the step (a), a DC voltage of the external input common-mode voltage signal is blocked by capacitors, the internal input common-mode voltage signal is generated by using the first resistor and the second resistor in series and the third resistor and the fourth resistor in series to divide voltage, or using a current source with a resistor string, or using a feedback amplifier to generate a bias voltage, and a cascade tail current flowing through two transistors in series provides a common-mode noise suppression capability to eliminate the dynamic swing of the internal input common-mode voltage signal.

In an embodiment, the rear-stage circuit is a receiver front-end equalizer or an amplifier circuit.

Another embodiment of the invention is a receiver front-end circuit operating method. In this embodiment, the receiver front-end circuit operating method is used for operating a receiver front-end circuit. The receiver front-end circuit includes a rail-to-rail input stage and a rear-stage circuit. The receiver front-end circuit operating method includes steps of: the rail-to-rail input stage increasing an input common-mode voltage receiving range to completely receive an external input common-mode voltage signal with dynamic common-mode voltage disturbance, performing an amplifying processing on the external input common-mode voltage signal and outputting an internal input common-mode voltage signal; and the rear-stage circuit receiving the internal input common-mode voltage signal from the rail-to-rail input stage; wherein the input common-mode voltage receiving range of the rail-to-rail input stage is larger than the input common-mode voltage receiving range of the rear-stage circuit.

In an embodiment, the rear-stage circuit is a receiver front-end equalizer or an amplifier circuit.

Compared to the prior art, the receiver front-end circuit and operation method thereof in the invention can greatly improve the limitation of the receiver front-end circuit on the static common-mode voltage range and dynamic common-mode voltage range of the input signal, especially when the system is subject to the dynamic common-mode voltage disturbances, the receiver front-end circuit of the invention can still correctly receive and process the input signals with a lot of dynamic common-mode voltage disturbances. Therefore, the failure of the conventional receiver front-end circuit due to a lot of dynamic common-mode voltage disturbances can be effectively avoided.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
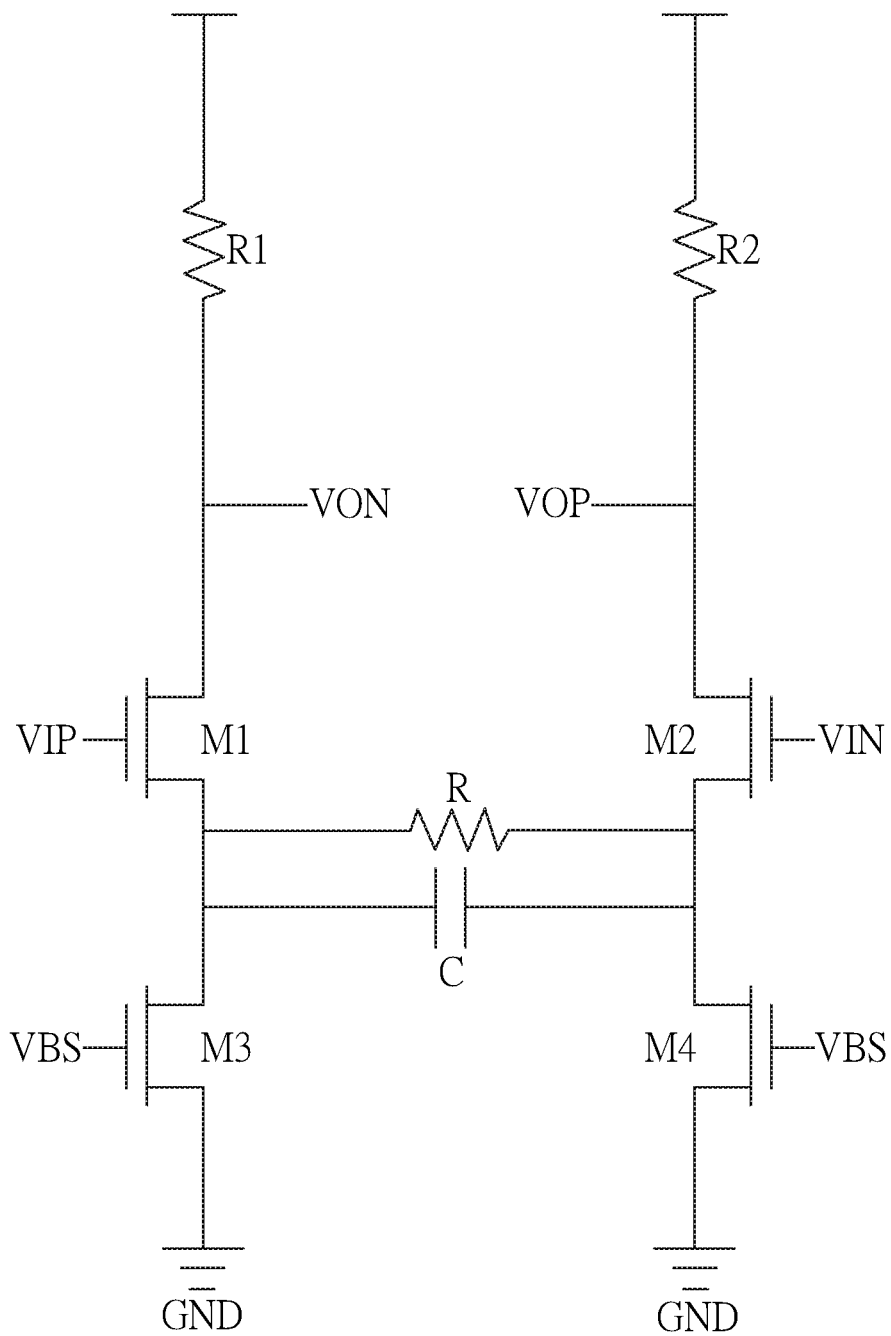
FIG. 1 is a schematic diagram of a conventional receiver front-end circuit.
Figure 2:
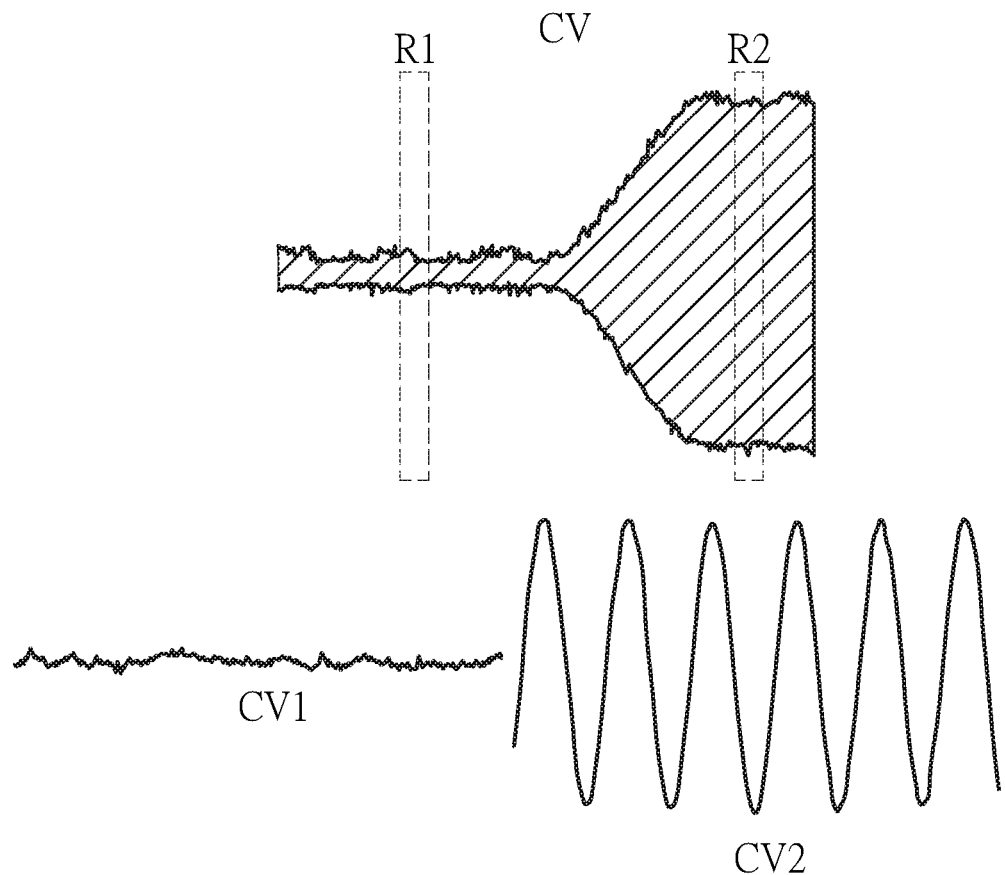
FIG. 2 is a schematic diagram that when the receiver front-end equalizer is operated normally, the input signal is suddenly disturbed by the noise, causing a phenomenon of dynamic common-mode voltage disturbance.
Figure 3:
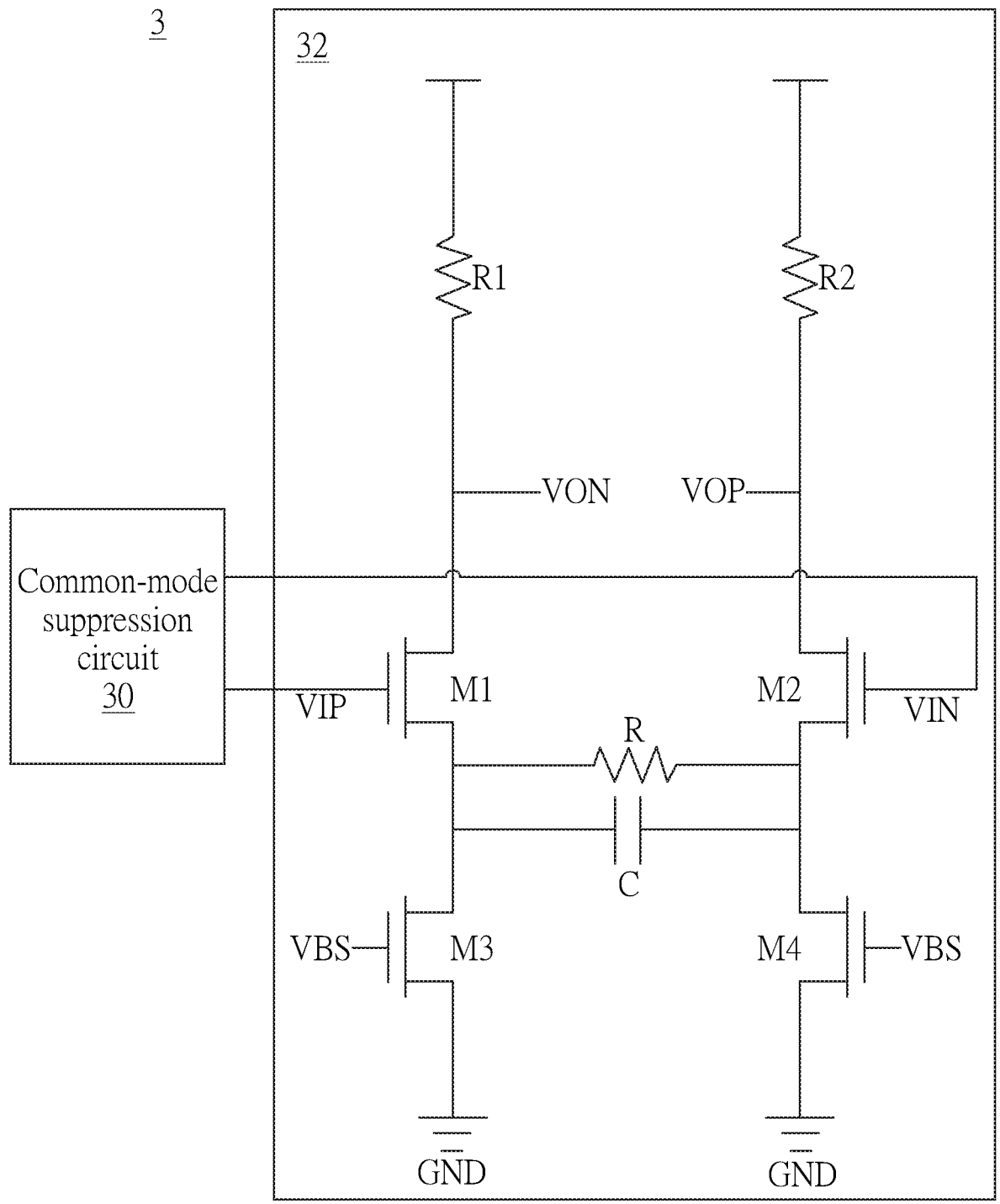
FIG. 3 is a schematic diagram of an embodiment of the receiver front-end circuit in a preferred embodiment of the invention.

An embodiment of the invention is a receiver front-end circuit. Please refer to FIG. 3. FIG. 3 is a schematic diagram of the receiver front-end circuit in this embodiment.

As shown in FIG. 3, the receiver front-end circuit 3 includes a common-mode suppression circuit 30 and a rear-stage circuit 32. The rear-stage circuit 32 is coupled to the common-mode suppression circuit 30. The common-mode suppression circuit 30 is configured to receive an external input common-mode voltage signal and perform a common-mode noise suppression processing on the external input common-mode voltage signal to output an internal input common-mode voltage signal. The rear-stage circuit 32 is configured to receive the internal input common-mode voltage signal. Wherein, s dynamic swing of the internal input common-mode voltage signal is smaller than s dynamic swing of the external input common-mode voltage signal.

In this embodiment, the rear-stage circuit 32 is a receiver front-end equalizer, but not limited to this. In another embodiment, the rear-stage circuit 32 can be a general amplifier circuit. The rear-stage circuit 32 includes a first resistor R1, a second resistor R2, a first transistor M1, a second transistor M2, a third transistor M3, a fourth transistor M4, a resistor R and a capacitor C.

The first transistor M1 is coupled to the first resistor R1, and a gate of the first transistor M1 is coupled to the common-mode suppression circuit 30 and controlled by a first input voltage VIP. The second transistor M2 is coupled to the second resistor R2, and a gate of the second transistor M2 is coupled to the common-mode suppression circuit 30 and controlled by a second input voltage VIN. The third transistor M3 is coupled between the first transistor M1 and a ground terminal GND, and a gate of the third transistor M3 is controlled by a control voltage VBS. The fourth transistor M4 is coupled between the second transistor M2 and the ground terminal GND, and a gate of the third transistor M3 is controlled by the control voltage VBS.

One terminal of the resistor R is coupled between the first transistor M1 and the third transistor M3 and another terminal of the resistor R is coupled between the second transistor M2 and the fourth transistor M4. One terminal of the capacitor C is coupled between the first transistor M1 and the third transistor M3 and another terminal of the capacitor C is coupled between the second transistor M2 and the fourth transistor M4. A first output voltage VON is outputted between the first resistor R1 and the first transistor M1. A second output voltage VOP is outputted between the second resistor R2 and the second transistor M2.

Figure 4:
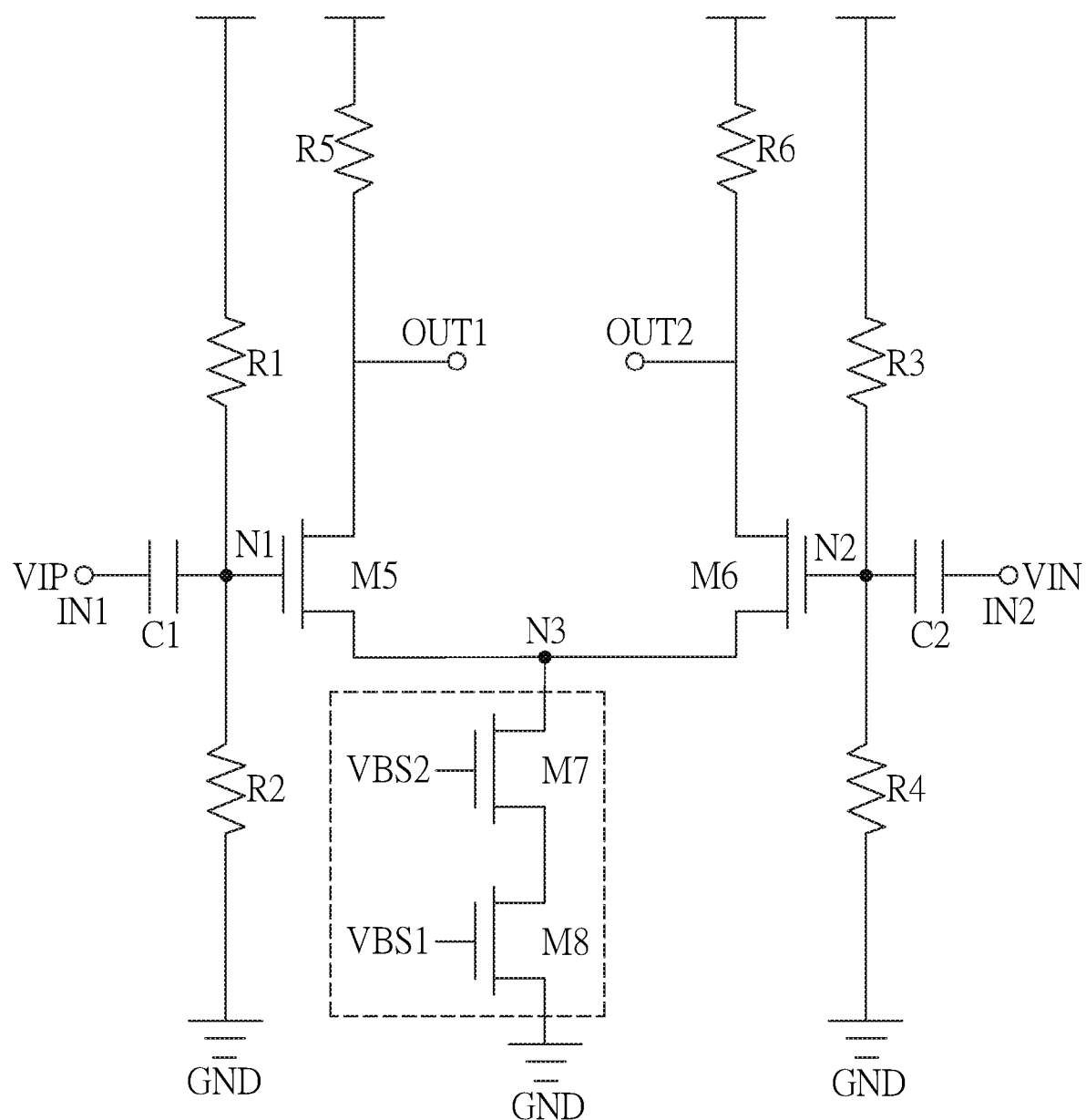
FIG. 4 is an embodiment of the common-mode suppression circuit in FIG. 3.

Next, please refer to FIG. 4. In an embodiment, the common-mode suppression circuit 30 can include a first capacitor C1, a second capacitor C2, a first resistor R1, a second resistor R2, a third resistor R3, a fourth resistor R4, a fifth transistor M5, a sixth transistor M6, a seventh transistor M7, an eighth transistor M8, a fifth resistor R5 and a sixth resistor R6. In this embodiment, the first transistor M1, the second transistor M2, the third transistor M3 and the fourth transistor M4 are all N-type transistors, but not limited to this.

The first capacitor C1 is coupled between a first input terminal IN1 and a first node N1. The second capacitor C2 is coupled between a second input terminal IN2 and a second node N2. The first resistor R1 is coupled to the first node N1. The second resistor R2 is coupled between the first node N1 and the ground terminal GND. The third resistor R3 is coupled to the second node N2. The fourth resistor R4 is coupled between the second node N2 and the ground terminal GND.

A gate of the fifth transistor M5 is coupled to the first node N1. A gate of the sixth transistor M6 is coupled to the second node N2. The seventh transistor M7 is coupled to the fifth transistor M5 and the sixth transistor M6 at a third node N3. The eighth transistor M8 is coupled between the seventh transistor M7 and the ground terminal GND. The seventh transistor M7 and the eighth transistor M8 are controlled by a control voltage VBS2 and a control voltage VBS1 respectively. The fifth resistor R5 is coupled to the fifth transistor M5 at a first output terminal OUT1. The sixth resistor R6 is coupled to the sixth transistor M6 at a second output terminal OUT2.

It should be noted that when the first input terminal IN1 and the second input terminal IN2 of the common-mode suppression circuit 30 receive the external input common-mode voltage signal, the first capacitor C1 and the second capacitor C2 are used to block a DC voltage of the external input common-mode voltage signal, and then the internal input common-mode voltage signal is generated by using the first resistor R1 and second resistor R2 coupled in series and the third resistor R3 and fourth resistor R4 coupled in series to divide voltage, or using a current source with a resistor string, or using the feedback amplifier to generate bias.

In addition, a cascade tail current flowing through the seventh transistor M7 and the eighth transistor M8 coupled in series can provide common-mode noise suppression capability to eliminate a dynamic swing of the internal input common-mode voltage signal.

Figure 5:
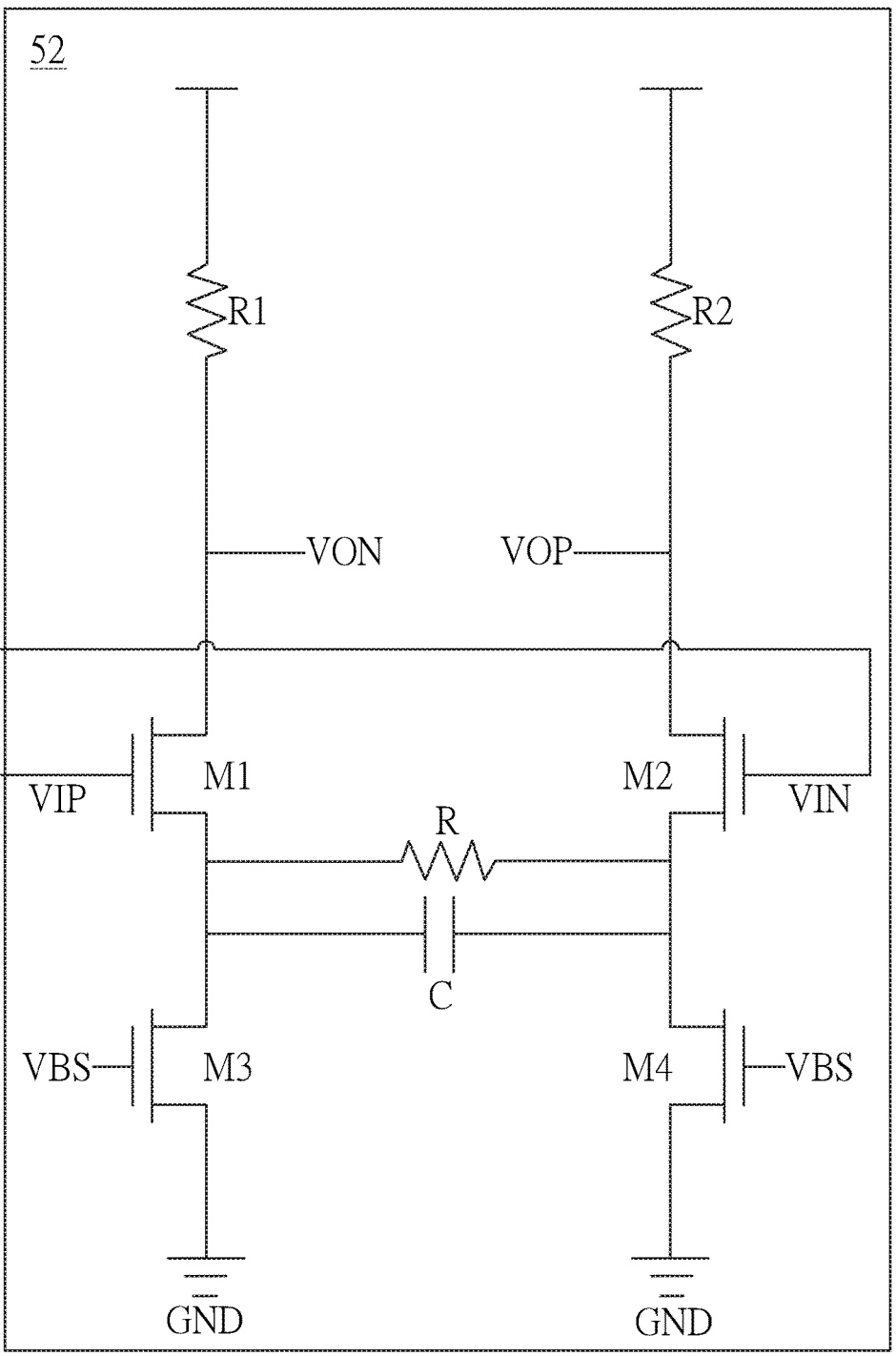
FIG. 5 is a schematic diagram of the receiver front-end circuit in another embodiment of the invention.

Another embodiment of the invention is also a receiver front-end circuit. Please refer to FIG. 5. FIG. 5 illustrates a schematic diagram of the receiver front-end circuit in this embodiment.

As shown in FIG. 5, the receiver front-end circuit 5 includes a rail-to-rail input stage 50 and a rear-stage circuit 52. The rail-to-rail input stage 50 is used to increase the input common-mode voltage receiving range, so as to completely receive the external input common-mode voltage signal with dynamic common-mode voltage disturbance and then perform amplifying processing on the external input common-mode voltage signal to output the internal input common-mode voltage signal. The rear-stage circuit 52 is coupled to the rail-to-rail input stage 50 to receive the internal input common-mode voltage signal. An input common-mode voltage receiving range of the rail-to-rail input stage 50 is larger than an input common-mode voltage receiving range of the rear-stage circuit 52.

In this embodiment, the rear-stage circuit 52 is a receiver front-end equalizer, but not limited to this. In another embodiment, the rear-stage circuit 52 can be a general amplifier circuit.

The rear-stage circuit 52 includes a first resistor R1, a second resistor R2, a first transistor M1, a second transistor M2, a third transistor M3, a fourth transistor M4, a resistor R and a capacitor C.

The first transistor M1 is coupled to the first resistor R1, and the gate of the first transistor M1 is coupled to the rail-to-rail input stage 50 and controlled by the first input voltage VIP. The second transistor M2 is coupled to the second resistor R2, and the gate of the second transistor M2 is coupled to the rail-to-rail input stage 50 and controlled by the second input voltage VIN. The third transistor M3 is coupled between the first transistor M1 and the ground terminal GND and controlled by the control voltage VBS.

The fourth transistor M4 is coupled between the second transistor M2 and the ground terminal GND and controlled by the control voltage VBS.

One terminal of the resistor R is coupled between the first transistor M1 and the third transistor M3 and another terminal of the resistor R is coupled between the second transistor M2 and the fourth transistor M4. One terminal of the capacitor C is coupled between the first transistor M1 and the third transistor M3 and another terminal of the capacitor C is coupled between the second transistor M2 and the fourth transistor M4.

Figure 6:
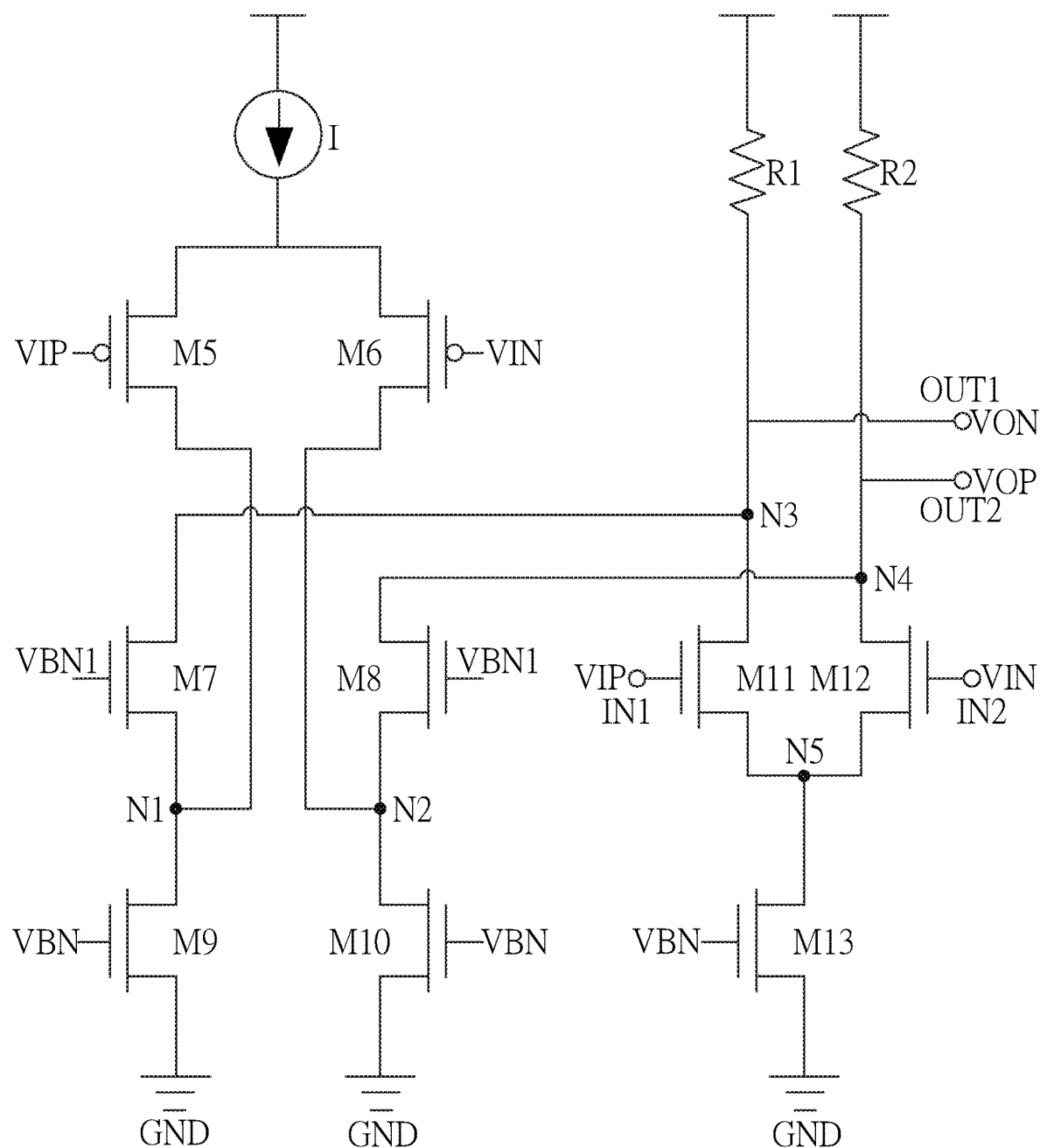
FIG. 6 is an embodiment of the rail-to-rail output stage circuit in FIG. 5.

Next, please refer to FIG. 6. In an embodiment, the rail-to-rail input stage 50 includes a current source I, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a first resistor R1 and a second resistor R2.

The fifth transistor M5 is coupled to the current source I and the first node N1 and controlled by the first input voltage VIP. The sixth transistor M6 is coupled to the current source I and the second contact N2 and controlled by the second input voltage VIN. The seventh transistor M7 is coupled between the third node N3 and the first node N1 and controlled by the control voltage VBN1. The eighth transistor M8 is coupled between the fourth node N4 and the second node N2 and controlled by the control voltage VBN1. The ninth transistor M9 is coupled between the first node N1 and the ground terminal GND and controlled by the control voltage VBN. The tenth transistor M10 is coupled between the second node N2 and the ground terminal GND and controlled by the control voltage VBN.

The eleventh transistor M11 is coupled between the third node N3 and the fifth node N5 and the gate of the eleventh transistor M11 is coupled to the first input terminal IN1 and controlled by the first input voltage VIP. The twelfth transistor M12 is coupled between the fourth contact N4 and the fifth contact N5, and the gate of the twelfth transistor M12 is coupled to the second input terminal IN2 and controlled by the second input voltage VIN. The thirteenth transistor M13 is coupled between the fifth contact N5 and the ground terminal GND and is controlled by the control voltage VBN.

The first resistor R1 is coupled to the third node N3 and the first output terminal OUT1. The second resistor R2 is coupled to the fourth node N4 and the second output terminal OUT2. The first output terminal OUT1 and the second output terminal OUT2 respectively output a first output voltage VON and a second output voltage VOP.

Figure 7:
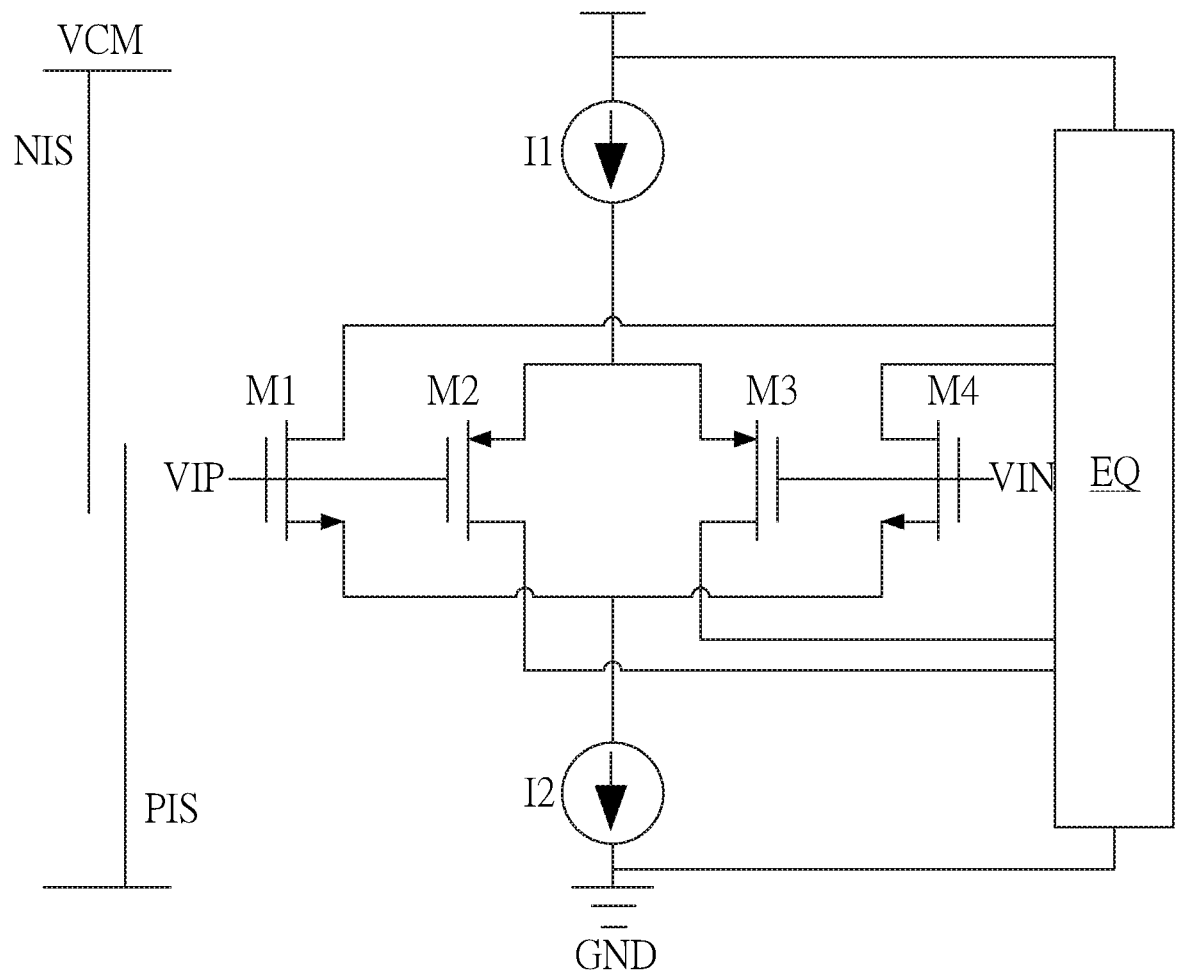
FIG. 7 is a schematic diagram of increasing the input common-mode voltage receiving range through the rail-to-rail output stage circuit.

Please refer to FIG. 7. FIG. 7 illustrates a schematic diagram of increasing the input common-mode voltage receiving range through the rail-to-rail input stage circuit.

As shown in FIG. 7, the first transistor M1 is coupled to the equalizer EQ and the second current source 12 and controlled by the first input voltage VIP. The second transistor M2 is coupled to the first current source I1 and the equalizer EQ and controlled by the first input voltage VIP. The third transistor M3 is coupled to the first current source I1 and the equalizer EQ and controlled by the second input voltage VIN. The fourth transistor M4 is coupled to the equalizer EQ and the second current source 12 and controlled by the second input voltage VIN. The second current source 12 is coupled to the ground terminal GND. The equalizer EQ is coupled to the first current source I1 and the second current source 12.

It should be noted that since the input common-mode voltage range VCM of the rail-to-rail input stage circuit can include an input common-mode voltage range of the N-type input stage NIS and an input common-mode voltage range of the P-type input stage PIS, the voltage range of the input common-mode voltage received by the rail-to-rail input stage circuit can be effectively increased. Therefore, even the input signal has dynamic common-mode voltage disturbances, the rail-to-rail input stage 50 can still receive it completely, amplify it and then output it to the rear-stage circuit 52.

Another embodiment of the invention is a receiver front-end circuit operating method. In this embodiment, the receiver front-end circuit operation method is used to operate a receiver front-end circuit. The receiver front-end circuit includes a common-mode suppression circuit and a rear-stage circuit. The rear-stage circuit can be a receiver front-end equalizer or an amplifier circuit.

Figure 8:
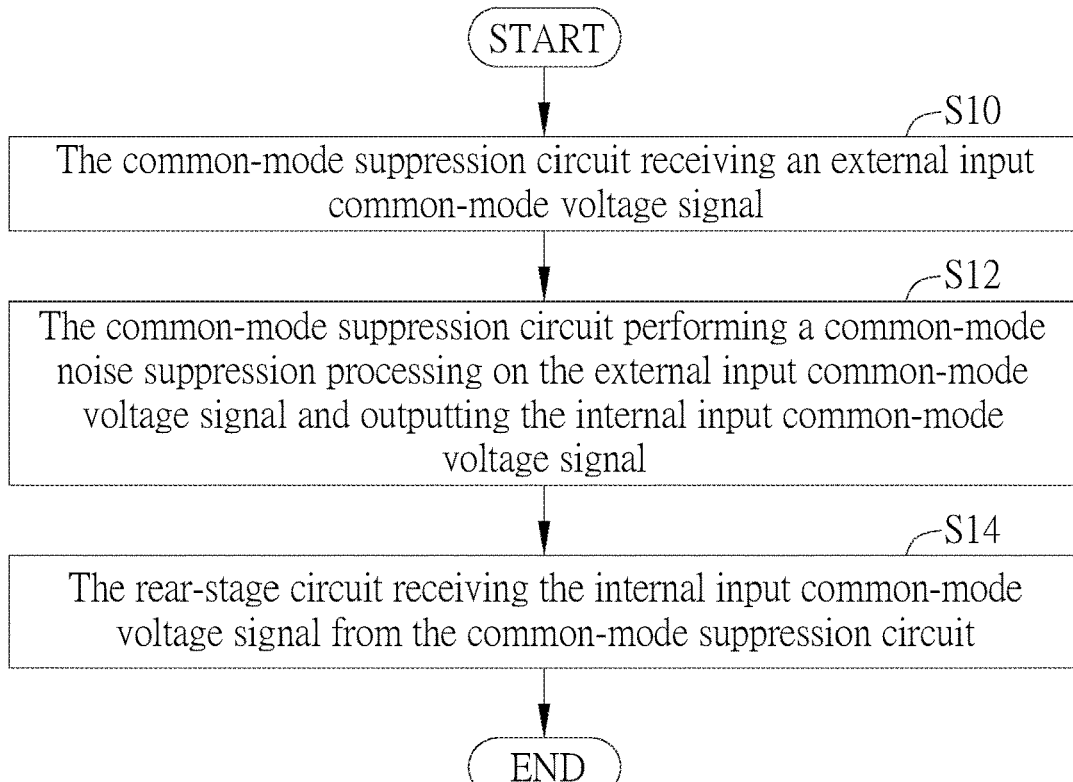
FIG. 8 is a flowchart of the receiver front-end circuit operating method in another embodiment of the invention.

Please refer to FIG. 8. FIG. 8 illustrates a flowchart of the receiver front-end circuit operating method according to another preferred embodiment of the invention. As shown in FIG. 8, the receiver front-end circuit operation method can include the following steps:

Step S10: the common-mode suppression circuit receiving an external input common-mode voltage signal;

Step S12: the common-mode suppression circuit performing a common-mode noise suppression processing on the external input common-mode voltage signal and outputting the internal input common-mode voltage signal; and Step S14: the rear-stage circuit receiving the internal input common-mode voltage signal from the common-mode suppression circuit.

Wherein, a dynamic swing of the internal input common-mode voltage signal is smaller than a dynamic swing of the external input common-mode voltage signal.

In practical applications, the step S12 can block the DC voltage of the external input common-mode voltage signal by capacitors, and then generate the internal input common-mode voltage signal by dividing voltage through a resistor string, or using a current source with a resistor string, using a feedback amplifier to generate a bias, and a cascade tail current flowing through the two transistors coupled in series provides a common-mode noise suppression capability to eliminate the dynamic swing of the internal input common-mode voltage signal.

Another embodiment of the invention is a receiver front-end circuit operating method. In this embodiment, the receiver front-end circuit operation method is used to operate the receiver front-end circuit. The receiver front-end circuit includes a rail-to-rail input stage and a rear-stage circuit. The rear-stage circuit can be a receiver front-end equalizer or an amplifier circuit.

Figure 9:
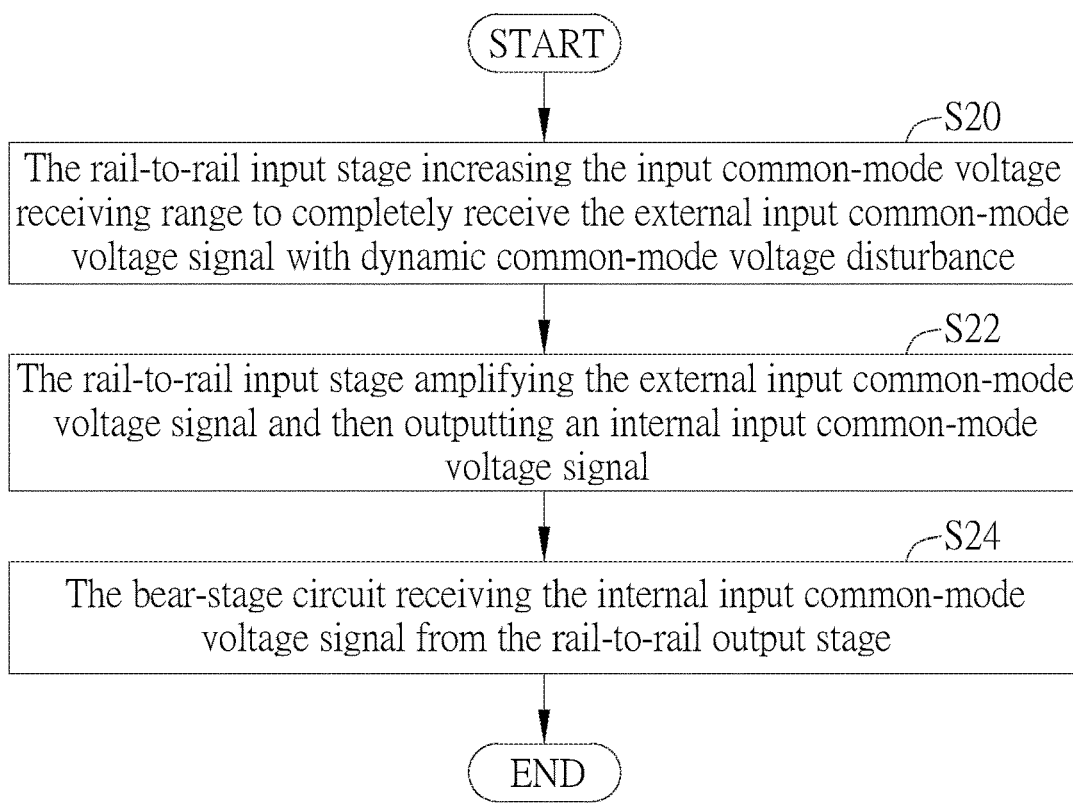
FIG. 9 is a flowchart of the receiver front-end circuit operating method in another embodiment of the invention.

Please refer to FIG. 9. FIG. 9 illustrates a flowchart of the receiver front-end circuit operating method in another preferred embodiment of the invention. As shown in FIG. 9, the receiver front-end circuit operating method can include the following steps:

Step S20: the rail-to-rail input stage increasing the input common-mode voltage receiving range to completely receive the external input common-mode voltage signal with dynamic common-mode voltage disturbance;

Step S22: the rail-to-rail input stage amplifying the external input common-mode voltage signal and then outputting an internal input common-mode voltage signal; and Step S24: the bear-stage circuit receiving the internal input common-mode voltage signal from the rail-to-rail output stage.

Wherein, the input common-mode voltage receiving range of the rail-to-rail input stage is larger than the input common-mode voltage receiving range of the rear-stage circuit.

Compared to the prior art, the receiver front-end circuit and operation method thereof in the invention can greatly improve the limitation of the receiver front-end circuit on the static common-mode voltage range and dynamic common-mode voltage range of the input signal, especially when the system is subject to the dynamic common-mode voltage disturbances, the receiver front-end circuit of the invention can still correctly receive and process the input signals with a lot of dynamic common-mode voltage disturbances. Therefore, the failure of the conventional receiver front-end circuit due to a lot of dynamic common-mode voltage disturbances can be effectively avoided.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A receiver front-end circuit, comprising:
    a common-mode suppression circuit, configured to receive an external input common-mode voltage signal, perform a common-mode noise suppression processing on the external input common-mode voltage signal and output an internal input common-mode voltage signal; and
    a rear-stage circuit, coupled to the common-mode suppression circuit and configured to receive the internal input common-mode voltage signal;
    wherein a dynamic swing of the internal input common-mode voltage signal is smaller than a dynamic swing of the external input common-mode voltage signal;
    wherein the rear-stage circuit is a receiver front-end equalizer, and the receiver front-end equalizer comprises:
    a first resistor;
    a second resistor;
    a first transistor, coupled to the first resistor, wherein a gate of the first transistor is coupled to the common-mode suppression circuit;
    a second transistor, coupled to the second resistor, wherein a gate of the second transistor is coupled to the common-mode suppression circuit;
    a third transistor, coupled between the first transistor and a ground terminal;
    a fourth transistor, coupled between the second transistor and the ground terminal;
    a resistor, wherein one terminal of the resistor is coupled between the first transistor and the third transistor and another terminal of the resistor is coupled between the second transistor and the fourth transistor; and
    a capacitor, wherein one terminal of the capacitor is coupled between the first transistor and the third transistor and another terminal of the capacitor is coupled between the second transistor and the fourth transistor.

2. The receiver front-end circuit of claim 1, wherein the common-mode suppression circuit comprises:
    a first capacitor, coupled between a first input terminal and a first node;
    a second capacitor, coupled between a second input terminal and a second node;
    a first resistor, coupled to the first node;
    a second resistor, coupled between the first node and a ground terminal;
    a third resistor, coupled to the second node;
    a fourth resistor, coupled between the second node and the ground terminal;
    a fifth transistor, wherein a gate of the fifth transistor is coupled to the first node;
    a sixth transistor, wherein a gate of the sixth transistor is coupled to the second node;
    a seventh transistor, coupled to the fifth transistor and the sixth transistor at a third node;
    an eighth transistor, coupled between the seventh transistor and the ground terminal;
    a fifth resistor, coupled to the fifth transistor at a first output terminal; and
    a sixth resistor, coupled to the sixth transistor at a second output terminal.

3. The receiver front-end circuit of claim 2, wherein when the first input terminal and the second input terminal of the common-mode suppression circuit receive external input common-mode voltage signal, a DC voltage of the external input common-mode voltage signal is blocked by the first capacitor and the second capacitor.

4. The receiver front-end circuit of claim 3, wherein the internal input common-mode voltage signal is generated by using the first resistor and the second resistor in series and the third resistor and the fourth resistor in series to divide voltage, or using a current source with a resistor string, or using a feedback amplifier to generate a bias voltage.

5. The receiver front-end circuit of claim 4, wherein a cascade tail current flowing through the seventh transistor and the eighth transistor in series provides a common-mode noise suppression capability to eliminate the dynamic swing of the internal input common-mode voltage signal.

6. The receiver front-end circuit of claim 1, wherein the first transistor, the second transistor, the third transistor and the fourth transistor are N-type transistors.

7. A receiver front-end circuit, comprising:
    a rail-to-rail input stage, configured to increase an input common-mode voltage receiving range to completely receive an external input common-mode voltage signal with dynamic common-mode voltage disturbance, perform an amplifying processing on the external input common-mode voltage signal and output an internal input common-mode voltage signal; and
    a rear-stage circuit, coupled to the rail-to-rail input stage and configured to receive the internal input common-mode voltage signal;
    wherein the input common-mode voltage receiving range of the rail-to-rail input stage is larger than the input common-mode voltage receiving range of the rear-stage circuit;
    wherein the rear-stage circuit is a receiver front-end equalizer, and the receiver front-end equalizer comprises:
    a first resistor;
    a second resistor;
    a first transistor, coupled to the first resistor, wherein a gate of the first transistor is coupled to the rail-to-rail input stage;
    a second transistor, coupled to the second resistor, wherein a gate of the second transistor is coupled to the rail-to-rail input stage;
    a third transistor, coupled between the first transistor and a ground terminal;
    a fourth transistor, coupled between the second transistor and the ground terminal;

a resistor, wherein one terminal of the resistor is coupled between the first transistor and the third transistor and another terminal of the resistor is coupled between the second transistor and the fourth transistor; and a capacitor, wherein one terminal of the capacitor is coupled between the first transistor and the third transistor and another terminal of the capacitor is coupled between the second transistor and the fourth transistor.

8. The receiver front-end circuit of claim 7, wherein the rail-to-rail input stage comprises:
   a current source;
   a fifth transistor, coupled to the current source;
   a sixth transistor, coupled to the current source;
   a seventh transistor, coupled to the fifth transistor at a first node;
   an eighth transistor, coupled to the sixth transistor at a second node;
   a ninth transistor, coupled between the first node and a ground terminal;
   a tenth transistor, coupled between the second node and the ground terminal;
   an eleventh transistor, coupled to a third node, wherein a gate of the eleventh transistor is coupled to a first input terminal;
   a twelfth transistor, coupled to a fourth node, wherein a gate of the twelfth transistor is coupled to a second input terminal;
   a thirteen transistor, coupled between a fifth node and the ground terminal;
   a first resistor, coupled to the third node and a first output terminal; and
   a second resistor, coupled to the fourth node and a second output terminal.

9. A receiver front-end circuit operating method, used for operating a receiver front-end circuit, the receiver front-end circuit comprising a common-mode suppression circuit and a rear-stage circuit, the receiver front-end circuit operating method comprising steps of:
   (a) the common-mode suppression circuit receiving an external input common-mode voltage signal, performing a common-mode noise suppression processing on the external input common-mode voltage signal and outputting an internal input common-mode voltage signal; and
   (b) the rear-stage circuit receiving the internal input common-mode voltage signal from the common-mode suppression circuit;
   wherein a dynamic swing of the internal input common-mode voltage signal is smaller than a dynamic swing of the external input common-mode voltage signal;
   wherein in the step (a), a DC voltage of the external input common-mode voltage signal is blocked by capacitors, the internal input common-mode voltage signal is generated by using the first resistor and the second resistor in series and the third resistor and the fourth resistor in series to divide voltage, or using a current source with a resistor string, or using a feedback amplifier to generate a bias voltage, and a cascade tail current flowing through two transistors in series provides a common-mode noise suppression capability to eliminate the dynamic swing of the internal input common-mode voltage signal.

\* \* \* \* \*